United States Patent [19]
Koss et al.

[11] Patent Number: 5,419,708
[45] Date of Patent: May 30, 1995

[54] PRINTED CIRCUIT CARD WITH MINOR SURFACE I/O PADS

[75] Inventors: Robert W. Koss, Burlington; Francis J. Thornton, Charlotte, both of Vt.

[73] Assignee: International Business Machines Corp., Armonk, N.Y.

[21] Appl. No.: 171,131

[22] Filed: Dec. 21, 1993

[51] Int. Cl.⁶ .............................................. H01R 4/66
[52] U.S. Cl. ...................................... 439/59; 439/637
[58] Field of Search ...................... 439/59, 60, 62, 637

[56] References Cited

U.S. PATENT DOCUMENTS

| | | | |
|---|---|---|---|
| 4,322,120 | 3/1982 | Rilling . | |
| 4,363,941 | 12/1982 | Nelson | 439/59 X |
| 4,548,452 | 10/1985 | Gillette . | |
| 4,595,250 | 6/1986 | Joly et al. . | |
| 4,806,110 | 2/1989 | Lindeman | 439/637 X |
| 4,838,804 | 6/1989 | Banjo et al. . | |
| 4,909,742 | 3/1990 | Ohkubo et al. . | |
| 4,919,626 | 4/1990 | Anhalt et al. . | |
| 5,040,999 | 8/1991 | Collier | 439/62 X |
| 5,162,002 | 11/1992 | Regnier . | |
| 5,239,748 | 8/1993 | Hamilton | 439/60 X |

OTHER PUBLICATIONS

IBM Technical Disclosure Bulletin vol. 8, No. 3, Aug. 1965.

*Primary Examiner*—David L. Pirlot
*Assistant Examiner*—Daniel Wittels
*Attorney, Agent, or Firm*—Thornton & Thornton

[57] ABSTRACT

A printed circuit card having first and second major surfaces joined by four minor surfaces and having I/O pads on either or both the major surfaces and on at least one of the minor surfaces.

The printed circuit card can be formed from a stack of insulating layers, one or more of which has a pattern of conductive lines disposed thereon. Selected ones of these conductive lines terminate in respective I/O pads positioned on one of said major card surfaces. By providing separate additional I/O pads on one of the edges or minor surfaces of the card additional conductive lines can be placed on the cards and terminated.

There is also disclosed a mating triplex connector socket for the improved card. This triplex connector comprises an elongated housing having a slot or recess therein for receiving the edge of the printed circuit card. Spring contacts are positioned along the walls and bottom of the recess for mating with and contacting the I/O pads positioned on the major and minor surfaces of the card.

16 Claims, 5 Drawing Sheets

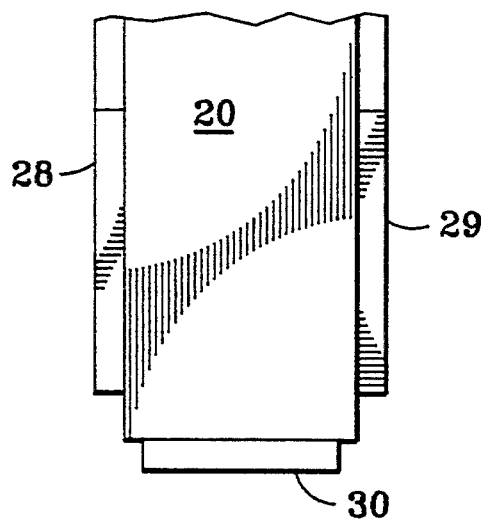
FIG. 4
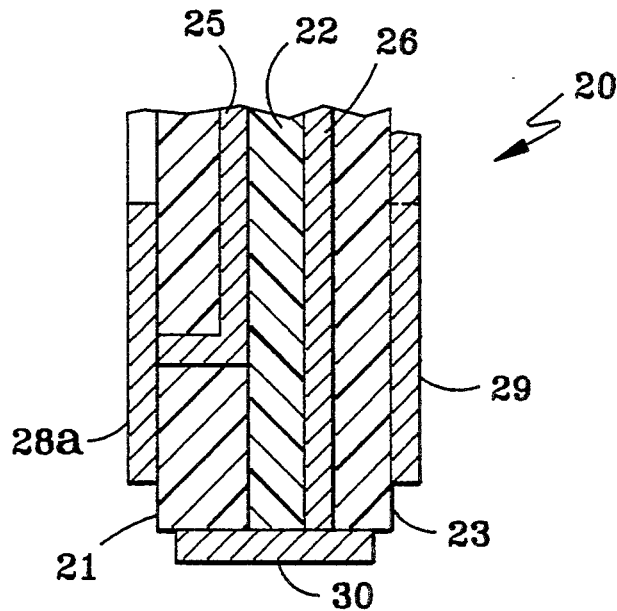
FIG. 5
FIG. 6
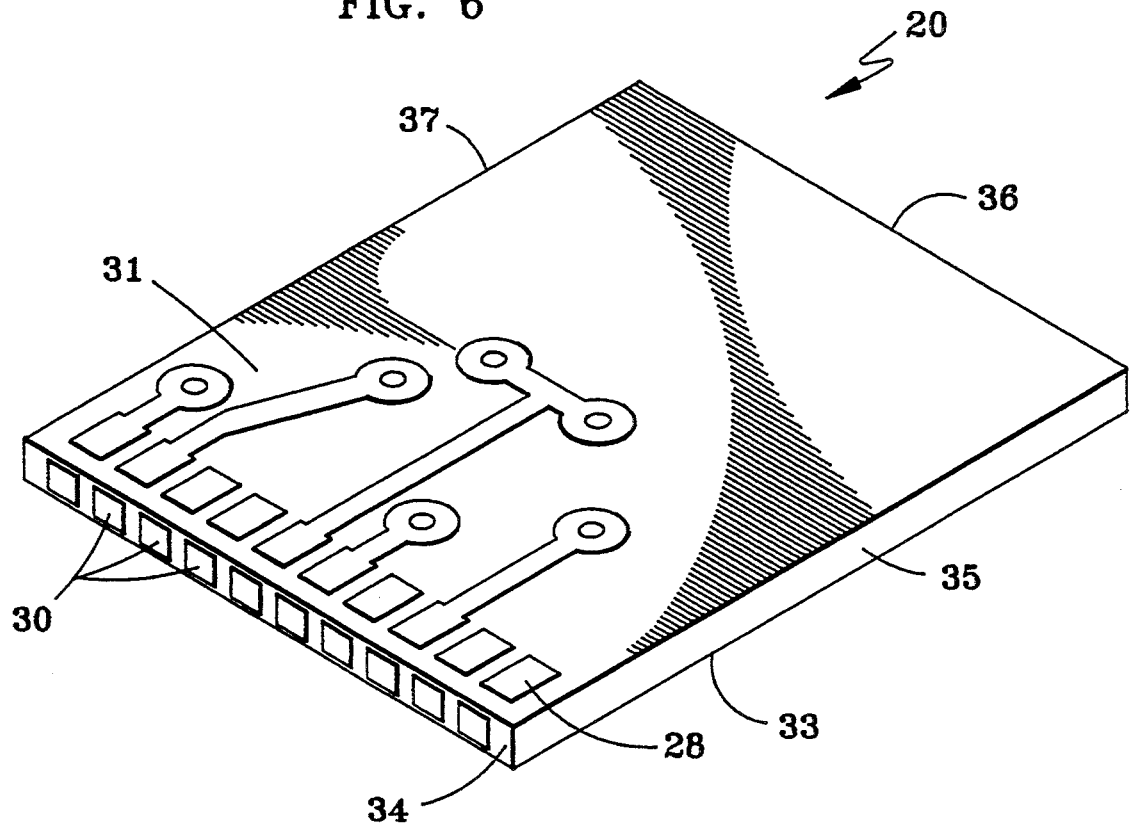

PRINTED CIRCUIT CARD WITH MINOR SURFACE I/O PADS

FIELD OF THE INVENTION

This invention relates generally to printed circuit cards and their mating sockets. More particularly, the invention relates to a printed circuit card having input-/output (I/O) pads or contacts on one of its minor surfaces. The invention also relates to a unique mating socket necessary for connection of the card of the invention to a next higher level of assembly.

BACKGROUND OF THE INVENTION

Electronic devices, both active, such as transistors, and passive, such as resistors, are often united to form an electronic circuit by mounting them on a printed circuit (PC) card or board formed of laminates of insulating material and deposited metallic wiring layers. As the required circuits become more complex they require more (I/O) pads in order to transfer signals to the next higher level of circuitry. Simultaneously, the industry is demanding that the size of these PC boards remain the same size if not become smaller. However, the pads must be of a minimum size to provide good interface contact. Therefore to achieve this demand of industry, the number of I/O pads must be increased.

Techniques for improving I/O pad density on the sides of such printed circuit cards are known in the prior art. One such improvement used two parallel rows in which the I/O pads in one row were staggered with respect to the I/O pads in the other row. This improvement resulted in a doubling in the number of I/O pads available on the card but did not achieve the ultimate density demanded by the industry.

SUMMARY OF THE INVENTION

The present invention achieves increased density in a printed circuit card, having first and second major surfaces joined by four minor surfaces, by providing I/O pads, in addition to those provided on either or both the major surfaces, on one of the minor surfaces.

In the preferred embodiment of the invention the printed circuit card has parallel major surfaces and is formed from a stack of insulating layers, each of which has a pattern of conductive lines disposed thereon. Selected ones of these conductive lines terminate in respective I/O pads positioned on one of said major card surfaces. These I/O pads are adjacent to, but separated from, the edge of the card. By providing separate additional I/O pads on one of the edges or minor surfaces of the card, additional conductive lines can be placed on the cards.

The present invention thus increases the number of I/O pads on each card without increasing the size of the card or of its mating socket thus providing for a denser, more compact printed circuit card.

Still further, as disclosed herein, there is provided a mating triplex connector socket for the improved card as taught by the present invention. This triplex connector comprises an elongated housing having a card receiving slot or recess therein for receiving the edge of the printed circuit card. Spring contacts are positioned along the walls of the recess and adapted for mating with and contacting the pads positioned on the major surfaces of the card, and additional spring contacts are positioned along the bottom of said recess and adapted for mating with and contacting the pads positioned on the minor surface of the card.

The present invention thus results in an improved printed circuit card in which denser circuits can be provided without increasing the overall size of the card.

More specifically, the present invention provides a a printed circuit card which has I/O pads on at least three surfaces for increasing the density of the circuitry on the card without increasing the card size. Accordingly, it is an object of the invention to provide a printed circuit card which provides more I/O pads for a given card size than is obtainable with prior art card designs.

It is another object of the invention to provide a printed circuit card which can be simply connected to the next higher level of circuitry.

It is still another object of the invention to provide a unique triplex connector socket for connecting a card with I/O pads on at least three surfaces to the next higher level of circuitry.

These and other objects and features of the present invention will become further apparent from the following description taken in conjunction with the drawings.

BRIEF DESCRIPTION OF THE DRAWINGS

FIG. 4 is a side view of a portion of the printed circuit card of FIG. 3 taken along line 4—4.

FIG. 5 is a partial sectional view of the card of FIG. 3 taken along line 5—5.

FIG. 6 is an isometric view of the card of FIG. 3.

DESCRIPTION OF THE PREFERRED EMBODIMENT

Figure 1:
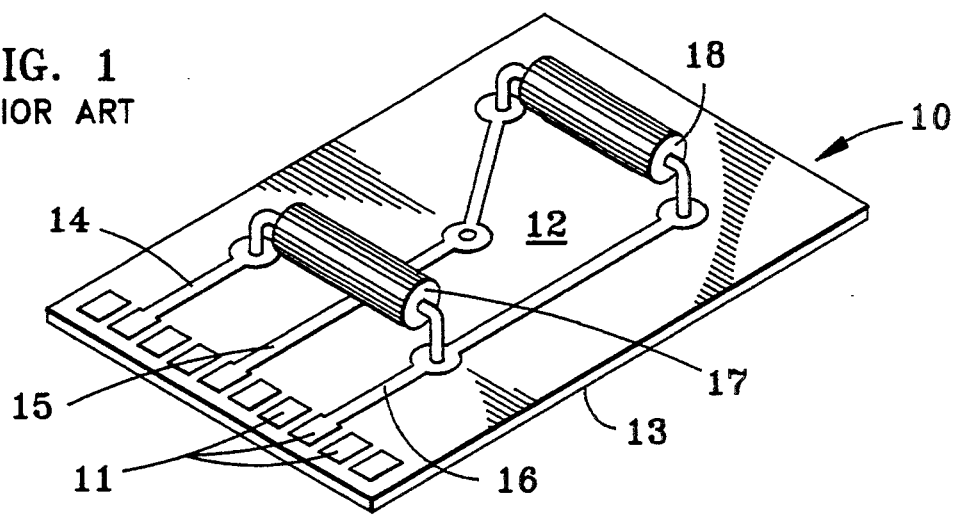
FIG. 1 is a plan view of a typical prior art printed circuit card with I/O pads on its major surfaces.
Figure 2:
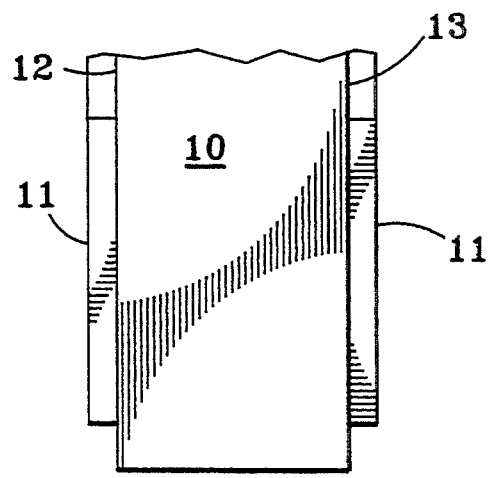
FIG. 2 is a partial side view of the printed circuit card of FIG. 1.

FIG. 1 shows a plan view of a typical prior art printed circuit card 10, formed of an insulating material, having major surfaces 12 and 13 and a plurality of I/O pads 11 on major surface 12. These I/O pads are arranged in a row and connected to selected wires 14, 15, and 16 which form a wiring pattern. Although not shown in this FIG. 1, the other major surface 13 would have similar pads and lines disposed thereon. Electrical components 17 and 18 are mounted on the card and connected to respective ones of the conductive lines. Although only two such components are shown, it should be understood that many such components are typically mounted on such boards and that these components can be both active devices, such as transistors and diodes, and passive devices, such as resistors and capacitors. It should also be noted that such cards are often provided with wiring patterns and I/O pads on both sides of the card as shown in FIG. 2. Furthermore, cards that have I/O pads on both sides can have these pads connected to wires on the opposite side by using vias or conductive pass throughs.

Figure 3:
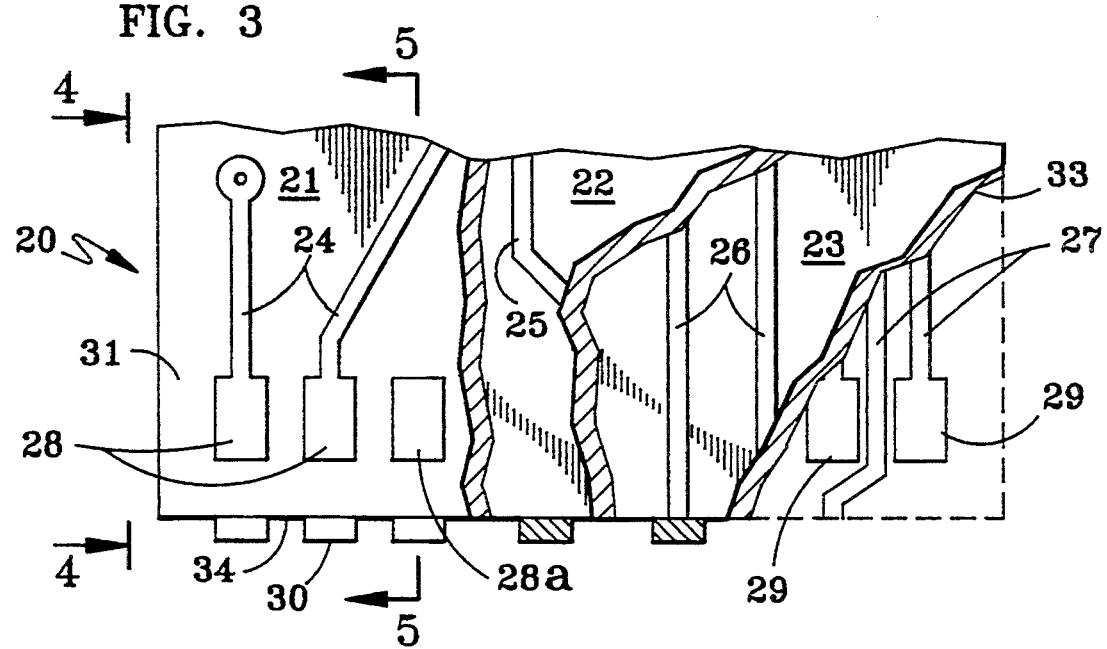
FIG. 3 is a partial sectional plan view of a printed circuit card employing the present invention and having I/O pads on its major and minor surfaces.

Turning now to FIGS. 3–6, the printed circuit card of the present invention will now be described. FIG. 3 is a partial, sectional plan view of a printed circuit card employing the present invention and having I/O pads on its major and minor surfaces. FIG. 4 is a side view of the printed circuit card of FIG. 3 taken along the line 4—4, while FIG. 5 is a sectional view of the card of FIG. 3 taken along the line 5—5. FIG. 6 is an isometric view of the card of FIG. 3.

The printed circuit card 20 shown in FIGS. 3–6 consists of three insulating layers 21, 22, and 23 and four wiring patterns 24, 25, 26, and 27, these patterns being best illustrated in FIG. 3. The card is thus preferably a parallelepiped with two major exposed surfaces 31 and 33 and four minor surfaces 34, 35, 36, and 37. However, it should be appreciated that card 20 may have virtually any configuration, e.g., a circular or donut-shaped configuration. Thus, as shown in FIG. 3, wiring pattern 24 is disposed on the first major surface 31, wiring pattern 25 is positioned between the layers 21 and 22, wiring pattern 26 is between the layers 22 and 23 and wiring pattern 27 is disposed on the other major surface 33. The patterns 25 and 26 are buried in the card. As shown in FIG. 3, each of these four wiring patterns can comprise a number of wires or conductive lines. Also on the first and second major surfaces 31 and 33 there is respectively provided a number of contact pads 28 and 29 which serve as terminations for various ones of the conductive lines in various ones of the patterns, as is known to the prior art. Similarly there is disposed on one of the minor surfaces, for example, surface 34, a plurality of pads 30, each of which also serves as a termination for various ones of the wiring patterns, but usually for the inner patterns 25 and 26. It should be understood that any one of the above-described pads can be connected to one or more wires in any one of the wiring patterns by using vias as is known to the art or may remain unconnected. It should also be noted that the pads 28 and 29 on the major surfaces 21 and 23 are not abutting the edge of the major surfaces but are located a selected distance back from the edge. This prevents the pads on the minor surface from touching the pads on the major surface, and thus electrical shorting between the pads is prevented. The pads on all the surfaces, both major and minor, need not be provided in regular rows but could be staggered with respect to the pads in the adjacent rows.

The present invention thus increases the number of I/O pads on each card without increasing the size of the card or its mating socket, thus resulting in a denser, more compact printed circuit card.

More specifically, the present invention provides a a printed circuit card which has I/O pads on at least three surfaces for increasing the density of the circuitry on the card without increasing the card size.

Figure 7:
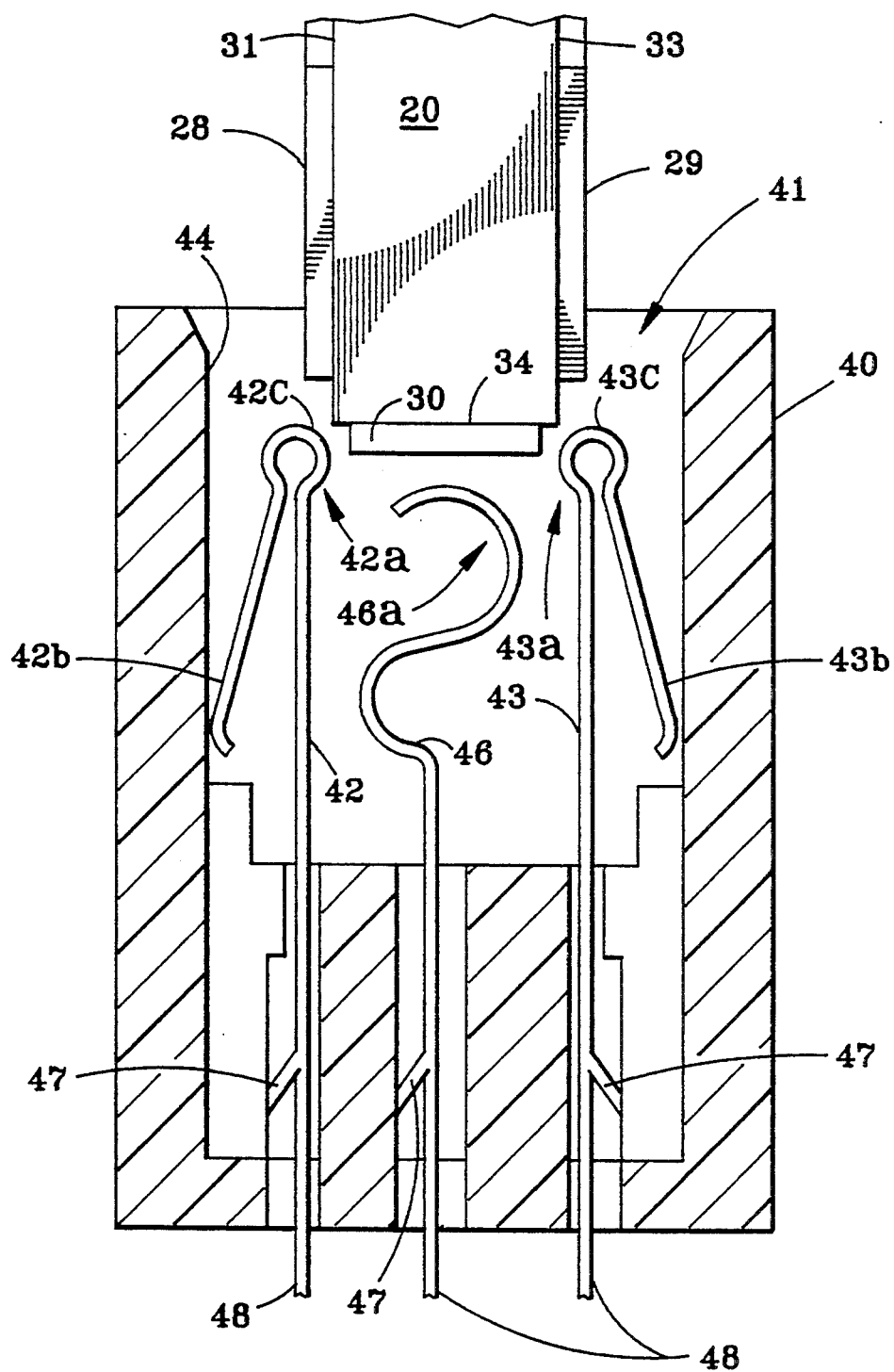
FIG. 7 shows the card of FIG. 4 positioned over a sectional view of a triplex socket adapted for connecting the card of the present invention to a higher level circuit or assembly.

Turning now to FIG. 7, there will be described a triplex socket adapted for connecting the card of the present invention, as shown in FIGS. 4–6, to a higher level assembly such as the motherboard for a personal computer. This mating triplex connector socket generally comprises an elongated housing 40 having a card receiving slot or recess 41 for receiving the edge of the printed circuit card 20. First and second sets 42 and 43 of spring contacts are positioned along the inner walls 44 and 45 of the recess, respectively. The contacts in each set are of course spaced or have a pitch that is complementary to the pitch of the pads they are to contact. These sets 42 and 43 of spring contacts are therefore designed and adapted for mating with and contacting the pads 28 and 29 respectively positioned on the first and second major surfaces 31 and 33 of the card 20. A third set of contacts 46, positioned along the center of recess 41, are adapted for mating with and contacting the pads 30 positioned on the minor surface 34 of card 20.

Each of these contacts 42, 43, and 46 are secured in the socket by suitable mechanical means such as barbs 47 which dig into the plastic body of the socket and have extended tails 48 for connection to the next higher level of assembly. The contacts 42 and 43 both have their upper ends 42a and 43a formed in a generally inverted U-shape and each has one short arm 42b and 43b respectively pressing against the inner walls of the recess to provide a spring action which will force the inner faces 42c and 43c against the respective pads 28 and 29. This spring action causes a wiping action to occur between the inner faces 42c and 43c and the respective pads 28 and 29 as the card is pushed into the recess. This wiping action removes any oxides or other films on the surface of the contacts and the respective pads and ensures a better electrical contact between the contacts and the respective pads.

Each central contact 46 has its upper end 46a formed generally in an S-shape. This S-shape provides a spring action as the card is forced down against it. Again, this spring action wipes the surfaces of the contact and pad and causes oxides or other films on the surfaces to be removed, thereby ensuring a good electrical contact is achieved between the pads 30 and the contacts 46.

Although contact 46 has been described and shown as an S-shaped member, it should be appreciated that other designs may be employed so long as the contact has the ability to be compressible while simultaneously retaining spring-biased contact with edge pad 30. For instance, a telescopic spring-biased contact, e.g., a so-called pogo pin, may be used in place of contact 46.

Figure 8:
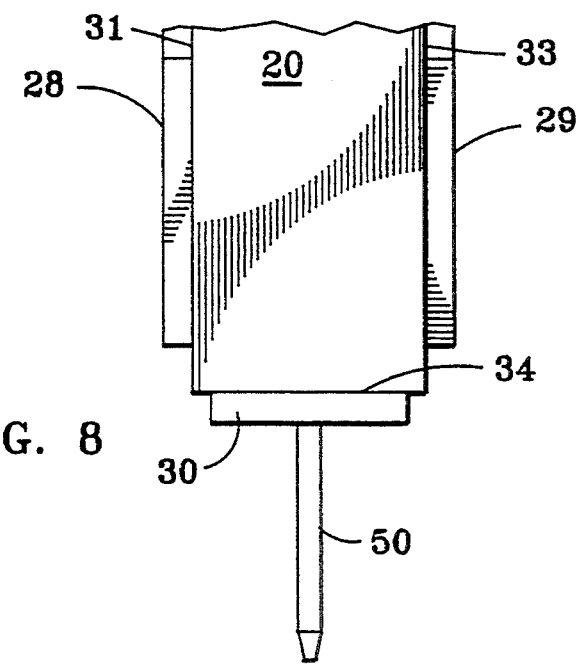
FIG. 8 is a side view of a different embodiment of the present invention.
Figure 9:
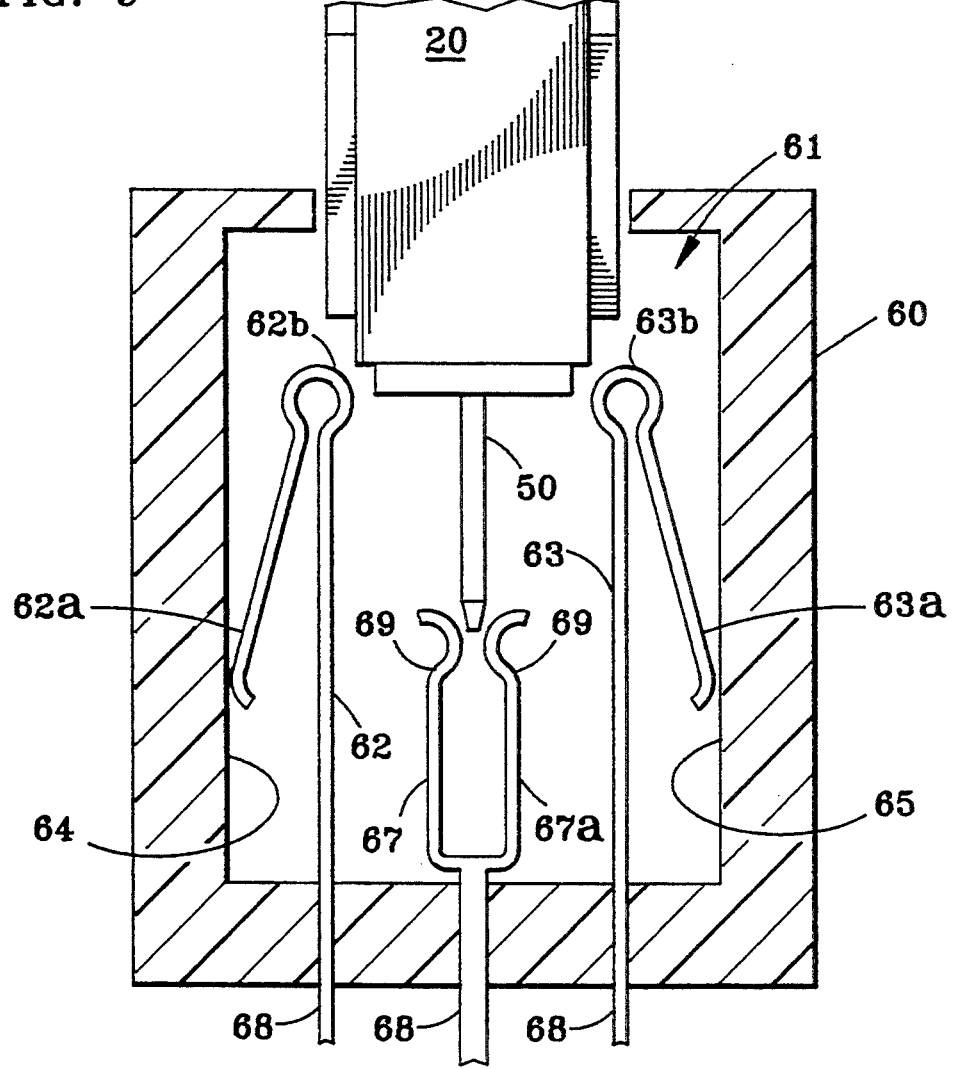
FIG. 9 is a side view of the card of FIG. 8 positioned over a cross-sectional view of its mating triplex connector socket.

FIG. 8 illustrates another variation of the card of the present invention. In this embodiment, the pad 30 is provided with an extended pin 50. The remainder of the card remains the same as the card illustrated in FIGS. 3–7, and like numbers refer to the identical elements described above. FIG. 9 shows the card of FIG. 8 partially introduced into its mating triplex socket. This mating triplex connector socket also generally comprises an elongated housing 60 having a card receiving slot or recess 61 for receiving the edge of the printed circuit card 20. First and second sets 62 and 63 of spring contacts are positioned along the inner walls 64 and 65 of recess 61, respectively. The contacts in each set have a pitch that is complementary to the pitch of the pads they are to contact. These sets 62 and 63 of spring contacts are therefore designed and adapted for mating with and contacting the pads 28 and 29, respectively, positioned on the first and second major surfaces 21 and 33 of the card 20 and are substantially identical to the contacts 42 and 43 shown in FIG. 7. A third set of contacts 66, positioned along the center of 61, are adapted for mating with and contacting pins 50.

These rows of contacts are again secured in the socket by suitable mechanical means and again have extended tails 68 for connection to the next higher level of assembly. The contacts 62 and 63 both have their upper end formed in a generally inverted U-shape with one arm 62a and 63a respectively pressing against the inner walls of the recess to force the inner faces 62b and 63b against the respective pads 28 and 29. As the card is inserted into the recess, this force again causes the contacts to wipe the pads and ensures satisfactory electrical contact is achieved between the contacts and the respective pads.

The central contact 66 is bifoliated. That is, its upper end is formed in a U-shape, with opposing leaves 67 and 67a, for receiving the pin 50 therebetween. The tip of each leaf is provided with a reverse curve 69. These curved tips serve several functions in that they permit easier initial penetration by the tip of each pin therebetween, create wiping between the leaves and the pins 50 thus removing any oxides and the like from the pins, and finally assure a tight close fit between the leaves and the pins.

Figure 10:
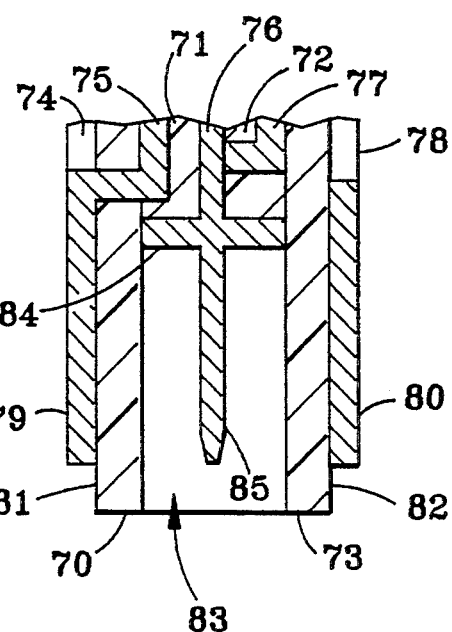
FIG. 10 illustrates in cross-section still another variation of the card of the present invention.
Figure 11:
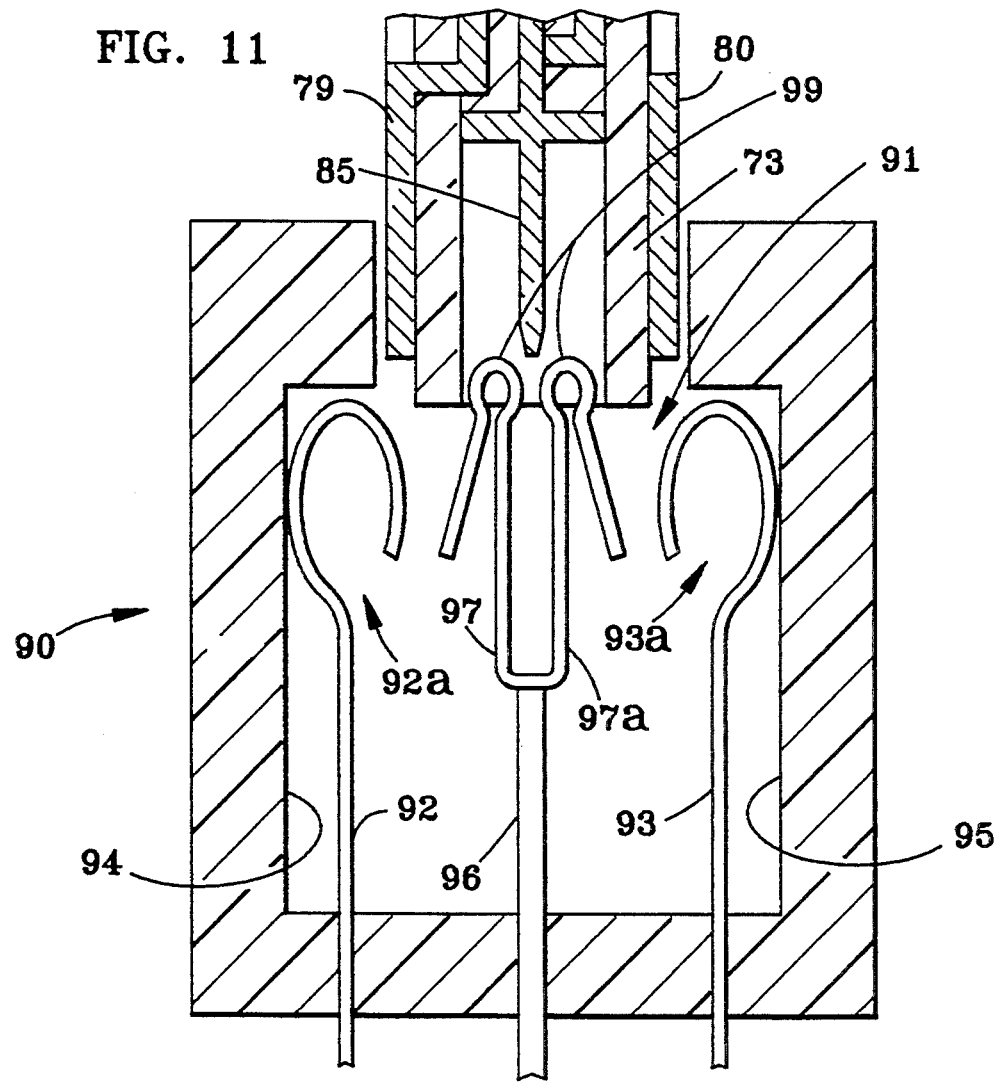
FIG. 11 is a cross-sectional view of the card of FIG. 10 partially introduced into its mating triplex connector socket which is also shown in cross-section.

FIG. 10 illustrates another variation of the card of the present invention and FIG. 11 is a view of the card of FIG. 10 positioned above a cross-sectional view of its mating triplex connector socket.

The card shown in FIG. 10 comprises four insulating layers 70, 71, 72, and 73 and five layers of wiring 74, 75, 76, 77, and 78. Again contact pads 79 and 80 are provided on the exterior surfaces 81 and 82 of the card. As shown in FIG. 10, the two outer insulating layers 70 and 73 extend past the shorter inner insulating layers 71 and 72 to form a recess 83. On the ends of the inner layers which form the bottom of this recess, an additional row of contact pads 84 are formed, as taught above, and each is provided with an extended pin 85. The pin 85 is not long enough to extend past the extended layers 70 and 73 and thus are protected from damage.

FIG. 11 shows the card of FIG. 10 positioned above its mating triplex socket. This mating triplex connector socket generally comprises an elongated housing 90 having a card receiving slot or recess 91 for receiving the edge of the printed circuit card of FIG. 10. First and second sets 92 and 93 of spring contacts are positioned adjacent the inner walls 94 and 95 of the recess, respectively. The contacts in each set have a pitch which is complementary to the pitch of the pads they are to contact. These sets 92 and 93 of spring contacts are therefore designed and adapted for mating with and contacting pads 79 and 80, respectively, positioned on the first and second major surfaces 81 and 82 of the card and are extended metallic leads having inverted U-shaped upper ends 92a and 93a, the shorter legs of which are directed toward the center of recess 91. A third set of contacts 96, positioned along the center of recess 91, are adapted for mating with and contacting pins 85.

All rows of contacts 92, 93 and 96 are, of course, secured in the socket by suitable mechanical means and again have extended tails for connection to the next higher level of assembly. As a result of the inverted U-shape of contacts 92 and 93, the longer arms thereof press against the inner walls 94 and 95 of 91 recess, thereby forcing the inner faces of the shorter arms 92a and 93a against the respective pads 79 and 80. As the card is inserted into recess 91, this force causes the contacts to wipe the pads and ensures satisfactory electrical contact is achieved between the contacts and the respective pads.

Each of the central contacts 96 is bifoliated. That is, the upper end is formed in a U-shape, with opposing leaves 97 and 97a, for receiving the pin 85 therebetween. The tip of each leaf is provided with a reverse U-shape tip 99. These tips serve several functions in that they permit easier initial penetration by the tip of each pin therebetween, create wiping between the leaves and the pins 85 thus removing any oxides and the like from the pins, and finally assume a tight close fit between the leaves and the pins.

It should be noted that the central contacts 96 and the side contacts 92 and 93 could be made similar to the contacts illustrated in FIG. 9.

While the invention has been particularly described with respect to a preferred embodiment and several variations thereon, it should be understood that one skilled in the art can, from the foregoing, readily make further changes in form and detail without departing from the spirit and scope of the invention.

What is claimed is:

1. A printed circuit card comprising;
a stack of insulating layers, each layer having first and second major sides and minor sides connecting said major sides;
a plurality of wiring circuits disposed on one or more of said insulating layers;
each of said circuits having a plurality of signal lines terminating in a respective contact pad; and
characterized by a first group of said pads being positioned on at least one of said major sides adjacent, but and separated from, at least one of said minor sides and a second group of said pads being positioned on one of said minor sides, but separated from said first group of contact pads;
each pad of said second group of pads being provided with an extended pin.

2. A printed circuit card comprising;
a stack of insulating layers, each layer having first and second major sides and minor sides connecting said major sides;
a plurality of wiring circuits disposed on one or more of said insulating layers;
each of said circuits having a plurality of signal lines terminating in a respective contact pad; and
characterized by a first group of said pads being positioned on at least one of said major sides adjacent, but and separated from, at least one of said minor sides and a second group of said pads being positioned on one of said minor sides, but separated from said first group of contact pads;
one of said edges being provided with a recess and each pad of said second group of pads is located in said recess;
each pad of said second group of pads located in said recess being provided with an extended pin.

3. The printed circuit card of claim 2 wherein each said layer is rectangular and said minor sides are the edges of the cards and are perpendicular to said major surfaces.

4. The card of claim 2 wherein wiring circuits are disposed on each of said layers.

5. A printed circuit card-connector combination comprising:
a printed circuit card comprising:

a stack of insulating layers, each layer having first and second major sides and minor surfaces connecting said major sides;

a plurality of wiring circuits on or more of said insulating layers;

each of said circuits having a plurality of signal lines terminating in a respective contact pad, a first group of said pads positioned on one of said major sides adjacent to, but separated from, said minor sides;

a second group of pads being positioned on one of minor surfaces and separated from said contact pads on said major surface; and a connector comprising;

an insulative housing having a recess for receiving said card therein;

a first set of spring contacts positioned along a wall of said recess adapted for mating with and contacting said first group of pads; and a second set of spring contacts positioned along a bottom of said recess adapted for mating with and contacting said second group of pads.

6. A printed circuit card-connector combination comprising:

a printed circuit card comprising:

a stack of insulating layers, each layer having first and second major sides and minor sides connecting said major sides;

a plurality of wiring circuits disposed on one or more of said insulating layers;

each of said circuits having a plurality of signal lines terminating in a respective contact pad, a first group of said pads positioned on at least one of said major sides adjacent but separated from at least one of said edges;

a second group of said pads being positioned on one of said edges and separated from said first group; and a connector comprising:

an insulative housing having a recess for receiving said card;

a first set of spring contacts positioned along a wall of said recess adapted for mating with and contacting said first group of pads; and a second set of spring contacts positioned along a bottom of said recess adapted for mating with and contacting said second group of pads.

7. A printed circuit card-connector combination comprising:

a printed circuit card comprising:

a stack of insulating layers, each layer having first and second major sides and minor surfaces connecting said major sides;

a plurality of wiring circuits on or more of said insulating layers;

each of said circuits having a plurality of signal lines terminating in a respective contact pad, a first group of said pads positioned on one of said major sides adjacent to, but separated from, said minor sides;

a second group of pads being positioned on one of minor surfaces and separated from said contact pads on said major surface; and a connector comprising;

an insulative housing having a recess for receiving said card therein;

a first set of spring contacts positioned along a wall of said recess adapted for mating with and contacting said first group of pads; and a second set of spring contacts positioned along a bottom of said recess adapted for mating with and contacting said second group of pads;

each pad of said second group of pads being provided with an extended pin; and said second set of spring contacts positioned along the bottom of said recess being adapted for mating with and contacting the extended pins provided on the second group of pads.

8. The printed circuit card connector combination of claim 7 wherein said first and second sets of spring contacts are provided with a spring action to wipe the contacts as the card is brought into contact therewith.

9. The printed circuit card-connector combination of claim 7 wherein the first set of contacts have their upper ends formed in a U-shape and the upper end of said second set of contacts are bifoliated.

10. The printed circuit card-connector combination of claim 9 wherein the tips of said bifoliated contacts are provided with a reverse curve to wipe said extended pins as the pins enter said bifoliated ends.

11. A printed circuit card-connector combination comprising:

a printed circuit card comprising:

a stack of insulating layers, each layer having first and second major sides and minor sides connecting said major sides;

a plurality of wiring circuits disposed on one or more of said insulating layers;

each of said circuits having a plurality of signal lines terminating in a respective contact pad, a first group of said pads positioned on at least one of said major sides adjacent but separated from at least one of said edges;

a second group of said pads being positioned on one of said edges and separated from said first group; and a connector comprising:

an insulative housing having a recess for receiving said card;

a first set of spring contacts positioned along a wall of said recess adapted for mating with and contacting said first group of pads; and a second set of spring contacts positioned along a bottom of said recess adapted for mating with and contacting said second group of pads;

one of said edges being provided with a recess and each pad of said second group of pads being located in said recess and provided with an extended pin; and said second set of spring contacts positioned along the bottom of said recess being adapted for mating with and contacting said extended pins provided on said second group of pads.

12. The printed circuit card-connector combination of claim 11 wherein the first set of contacts have their upper ends formed in a U-shape and the upper end of said each contact in the second set of contacts are formed in an S-shape.

13. A triplex connector comprising:

an insulative housing having an longitudinal recess with extended parallel walls for receiving a printed circuit card having first and second major surfaces and minor surfaces connecting said major surfaces;

first and second sets of spring contacts positioned respectively along said parallel walls of said recess and adapted for mating with and contacting first and second groups of pads disposed on the major surfaces of the card; and a third set of spring contacts positioned along a bottom of said recess adapted for mating with and contacting a third group of pads disposed along a minor surface of the card.

14. A printed circuit card comprising:

a stack of insulating layers forming a right parallelepiped with first and second major sides and four minor sides perpendicular to said major sides;

a plurality of wiring circuits disposed on at least one of said major sides and a plurality of wiring circuits internal to said parallelepiped;

each of said circuits having a plurality of signal lines terminating in a respective contact pad;

a first group of said pads being positioned on one of said major sides adjacent to but spaced from at least one of said minor sides;

a second group of said pads being positioned on a first one of said minor sides; and a third group of pads on said second major surface; and a fourth group of pads on a second one of said minor surfaces, the pads in said first group being arranged in parallel rows and the pads in said rows being staggered with respect to each other.

15. A printed circuit card comprising:

a stack of insulating layers, having first and second outer layers and an internal layer, forming a regular parallelepiped having first and second major sides and edges connecting said major sides;

one of said edges having a recess therein:

a plurality of wiring circuits disposed one or more of said insulating layers;

each of said circuits having a plurality of signal lines terminating in a respective contact pad; and a first group of said pads being positioned on at least one of said major sides of one of said outer layers and a second group of said pads being positioned in the recess on said edge;

said pads being provided with extended pins.

16. The card of claim 15 wherein said recess is of a specified depth, said pads are provided with extended pins and said pins are shorter than the depth of the recess.

* * * * *